United States Patent [19]
Petri

[11] 3,972,001
[45] July 27, 1976

[54] COMMON MODE REJECTION DYNAMIC FILTER CIRCUIT
[75] Inventor: Chris A. Petri, West Chicago, Ill.
[73] Assignee: Motorola, Inc., Schaumburg, Ill.
[22] Filed: Apr. 8, 1975
[21] Appl. No.: 566,640

[52] U.S. Cl................................. 330/22; 330/149
[51] Int. Cl.².......................................... H03F 1/26
[58] Field of Search...................... 330/22, 40, 149; 325/479, 483; 328/240, 265, 266

[56] References Cited
UNITED STATES PATENTS
3,283,252  11/1966  Mead et al...................... 328/265 X Primary Examiner—James B. Mullins
Attorney, Agent, or Firm—Eugene A. Parsons; James W. Gillman

[57] ABSTRACT

In amplifying circuitry, such as video amplifiers and the like, a resistor is connected between the common junction thereof and ground and a transistor biased for linear operation is connected between the power receiving junctions and a power source with a capacitor connected from the control electrode thereof to the common junction of the amplifying circuitry so that the power applied to the amplifying circuitry varies in a common mode with variations on the common junction to eliminate hum and the like.

3 Claims, 1 Drawing Figure

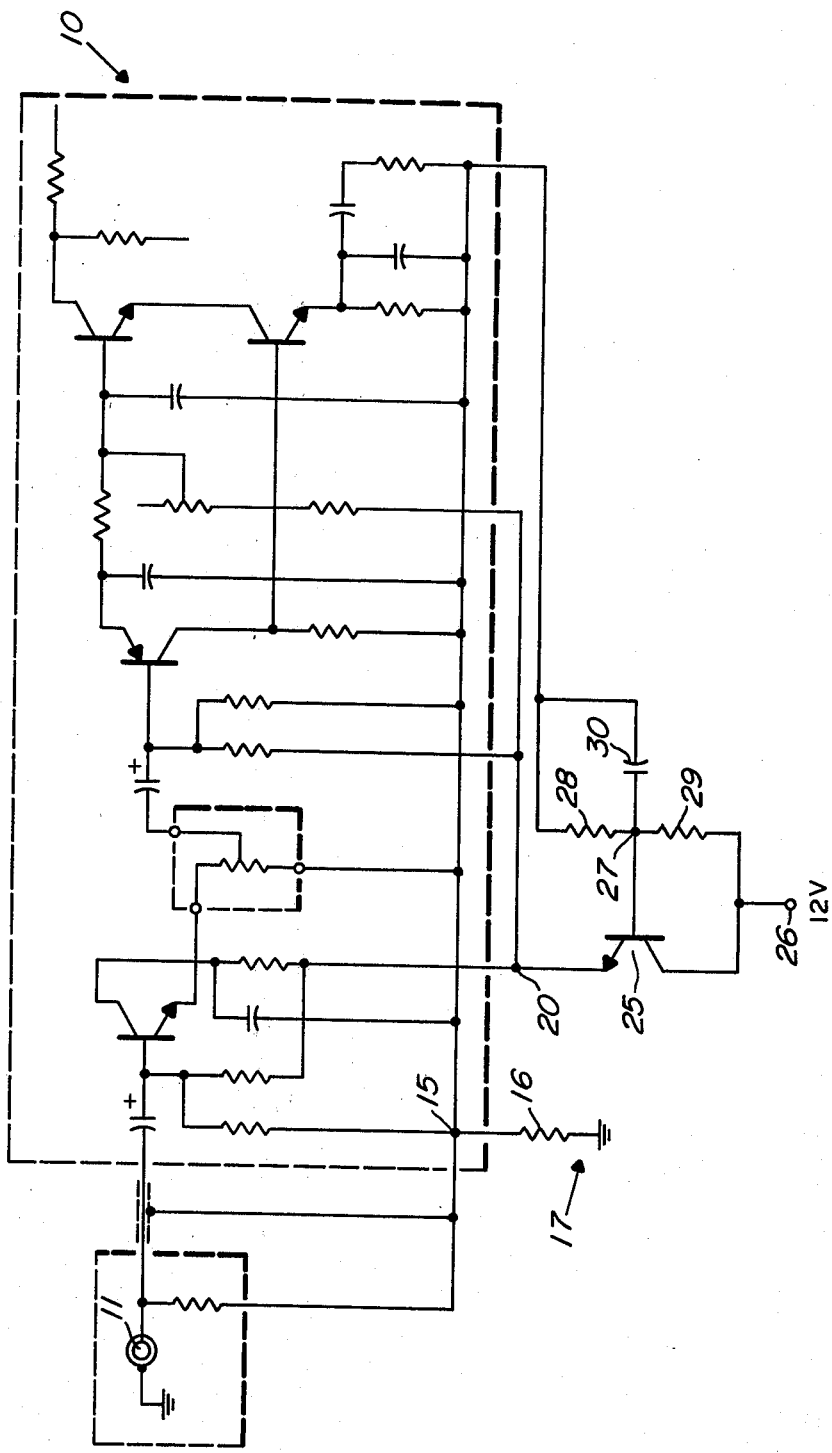

COMMON MODE REJECTION DYNAMIC FILTER CIRCUIT

BACKGROUND OF THE INVENTION

In video amplifiers and the like, hum produced by 60 cycle and other interfering signals is a serious problem. This is especially true in applications where cables are used to convey signals from a distant source. In prior art circuits common mode rejection can only be accomplished through the use of differential amplifiers through the application of the hum or other objectionable signal to both inputs thereof simultaneously and in phase. Since the use of differential amplifiers requires substantial engineering redesign and, in many cases, substantial additional circuitry, it is desirable to devise circuitry which will provide common mode rejection without requiring the redesign of existing circuitry.

SUMMARY OF THE INVENTION

The present invention pertains to a common mode rejection dynamic filter circuit for use in amplifying circuitry wherein impedance means are connected between a common junction of the amplifying circuitry and ground and transistor means biased to operate in a linear region are connected between power receiving junctions of the amplifying circuitry and the power source with a control input of the transistor means being coupled through a capacitor to the common junction of the amplifying circuitry so that the common junction and the power receiving junctions are fluctuating in a common mode and the bias circuits of the amplifier are unaffected thereby so that the desired signal appears as a difference voltage between base and emitter circuits and is amplified in the normal manner.

It is an object of the present invention to provide a new and improved common mode rejection, dynamic filter circuit for substantially eliminating hum and the like in amplifying circuitry.

It is a further object of the present invention to provide circuitry for allowing an amplifying circuit to float so that the biasing circuitry thereof is unaffected by hum and the like.

These and other objects of this invention will become apparent to those skilled in the art upon consideration of the accompanying specification, claims and drawing.

BRIEF DESCRIPTION OF THE DRAWING

The single FIGURE is a schematic view of a video amplifier having connected thereto a common mode rejection, dynamic filter circuit embodying the present invention.

DESCRIPTION OF THE PREFERRED EMBODIMENT

The numeral 10 generally designates amplifying circuitry, which in this embodiment is illustrated as a video amplifier utilized in a monitor circuit or the like. The amplifying circuitry 10 has an input 11 adapted to receive signals on a cable or the like from a remote unit. While the present common mode rejection, dynamic filter circuit is especially useful for eliminating hum and the like in amplifying circuitry which receives input signals on cables from distant or remote units, it should be understood that the amplifying circuitry 10 is simply disclosed for exemplary purposes and the present dynamic filter circuit may be utilized with equally good results in substantially any circuit where hum and the like create problems.

The amplifying circuitry 10 has a common junction 15 which, in prior art circuitry, is connected directly to the monitor chassis. In the present circuit, however, the common junction 15 is separated or divorced from ground 17 by a resistor 16. While ground 17 is the chassis in the present disclosure, it should be understood that ground will always be a common reference point for the system so that all signals including the hum or unwanted signals can be referenced thereto. While a resistor 16 is utilized in the present circuit it should be understood that substantially any impedance means might be utilized to maintain the amplifying circuitry 10 floating relative to the ground 17. The impedance value of the resistor 16, or any other impedance means utilized, should be chosen so that it is small relative to the values of any impedances attached thereto so that the effect on the operation of the amplifying circuitry 10 is minimized, but the impedance value of the resistor 16 must be sufficiently large to properly separate the amplifying circuitry 10 from the ground 17. In practice, these standards are met by a resistor having a value in the range of approximately 50 ohms through 2 or 3 thousand ohms, depending upon the impedance values in the circuitry being separated from ground. In the present circuit the resistor 16 has a value of 120 ohms.

The amplifying circuitry 10 has a plurality of power receiving junctions whereon B+ is applied to the various stages thereof. In prior art circuitry the power receiving junctions 20 are connected directly to a source of power through decoupling RC networks and the like. In the present embodiment the power receiving junctions 20 are connected directly to the emitter of an N-P-N type transistor 25. The collector of the transistor 25 is connected directly to a terminal 26 adapted to have connected thereto a source of power (not shown). In the present embodiment, the source of power connected to the terminal 26 will be a 12 volt supply. The base of the transistor 25 is connected to a junction 27 between a pair of series connected resistors 28 and 29. The resistors 28 and 29 are connected in series between the common junction 15 and the terminal 26 to provide a bias on the transistor 25 maintaining the operation thereof in its linear region. The junction 27 and, hence, the base of the transistor 25 is further coupled through a capacitor 30 to the common junction 15. The capacitor 30 must be sufficiently large to couple the unwanted signals, such as hum and the like, to the base of the transistor 25 so that the power supplied to the various stages of the amplifying circuitry 10 varies in a common mode with the fluctuations of the common junction 15. In the present embodiment the capacitor 30 has a value of approximately 22 micro farads at 25 volts so that all interfering signals, such as 60 cycle and the like, are coupled to the base of the transistor 25.

In the operation of the common mode rejection, dynamic filter circuit, any unwanted signals present in the amplifying circuitry 10, such as 60 cycle hum, will appear across the resistor 16 causing the common junction 15 to vary relative to ground 17 at the 60 cycle rate. This 60 cycle rate will be coupled through the capacitor 30 to the base of the transistor 25 so that power supplied to the power receiving juctions 20 will also vary at the 60 cycle rate in a common mode (i.e. substantially identical with respect both amplitude and time) relative to the ground 17. Thus, the entire amplifying circuitry 10 is floating above the ground 17 and the unwanted signals have no effect thereon. The desired signals applied to the input 11 appear as difference voltages between base and emitter circuits and are amplified in the normal manner with no hum components therein.

Thus, an improved common mode rejection, dynamic filter circuit is disclosed which is simple and inexpensive to manufacture and which may be easily incorporated into standard circuits without redesign thereof. In addition to removing unwanted signals which produce hum and the like, the present circuit provides additional filtering for the power supply connected to the terminal 26.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:

1. In amplifying circuitry having power receiving junctions and a common junction, a common mode rejection, dynamic filter circuit for substantially eliminating hum and the like, comprising:
   a. impedance means including a resistor connected from the common junction of the amplifying circuitry to ground for electrically separating the amplifying circuitry from ground;
   b. a transistor biased to operate in a linear region and connected from the power receiving junctions of the amplifying circuitry to a source of power, said transistor having a control electrode; and
   c. a capacitor coupling the control electrode of said transistor to the common junction of the amplifying circuitry for controlling said transistor to vary the power applied thereto in a common mode with variations of potential at the common junction.

2. A common mode rejection, dynamic filter circuit as claimed in claim 1 wherein the value of the resistor is approximately 120 ohms.

3. A common mode rejection, dynamic filter circuit as claimed in claim 1 wherein the transistor means includes an N-P-N type transistor having a collector connected to the source of power, an emitter connected to the power receiving junction of the amplifying circuitry, and a base connected to the capacitor.

* * * * *